United States Patent [19]

Singer et al.

[11] 4,045,730
[45] Aug. 30, 1977

[54] INCREMENTAL METHOD AND SYSTEM FOR ABSOLUTE MEASUREMENT OF COHERENT POWER AT MILLIMETER AND SUBMILLIMETER WAVELENGTHS

[75] Inventors: Abraham Singer, Silver Spring; Jan M. Minkowski, Baltimore, both of Md.

[73] Assignee: The United States of America as represented by the Secretary of the Army, Washington, D.C.

[21] Appl. No.: 688,440

[22] Filed: May 20, 1976

[51] Int. Cl.$^2$ .................................... G01R 19/00
[52] U.S. Cl. .......................... 324/76 R; 324/103 R
[58] Field of Search ................ 324/76 R, 76 A, 95, 324/103 R

[56] References Cited
PUBLICATIONS

J. D. Dorey, Proceedings of the Conference on Earth Station Technology, London, England, Oct. 14-16, 1970, pp. 175-180.

Primary Examiner—M. Tokar
Attorney, Agent, or Firm—Nathan Edelberg; Robert P. Gibson; Saul Elbaum

[57] ABSTRACT

A method and system for making absolute measurements of coherent rf power is described. The method surmounts the primary shortcoming of the other existing methods in that it permits absolute measurement of power at all radio frequencies, whereas the other methods are inherently frequency limited, with the current upper limit being about 75 GHz. This major advantage stems from the fact that this method utilizes a direct comparison of the unknown rf power with a primary standard, whereas all other methods require a conversion of the power to heat before making the comparison.

10 Claims, 1 Drawing Figure

INCREMENTAL METHOD AND SYSTEM FOR ABSOLUTE MEASUREMENT OF COHERENT POWER AT MILLIMETER AND SUBMILLIMETER WAVELENGTHS

RIGHTS OF THE GOVERNMENT

The invention described herein may be manufactured, used, and licensed by or for the U.S. Government for governmental purposes without the payment to us of any royalty thereon.

BRIEF DESCRIPTION OF THE PRIOR ART

As the frequency of an electromagnetic signal increases, the physical dimensions of the circuitry handling the signal begin to approach a significant fraction of the wavelength, and consequently the concepts of voltage and current tend to lose their usefulness and sometimes even their meaning. For example, it is difficult to define "voltage" in TM-modes in a rectangular waveguide because here the voltage is not equal to the simple line integral $\int \vec{E} \cdot \vec{ds}$ since the curl component of the total electromagnetic field vector does not vanish anywhere across the waveguide. Thus, as the frequency of an electromagnetic signal increases, it becomes increasingly important to measure the signal's power content. As a matter of fact, at microwave or higher frequencies, power is one of the two absolute measurements made upon a system.

Absolute measurement of power is of fundamental importance in directly establishing the proper functioning of high-frequency systems as well as of most types of high-frequency devices. Such measurements are required, for example, for determining such quantities as the output level of a radar transmitter, the sensitivity of a radio receiver, the burnout properties of a mixer and video detector. However, as the frequency increases, absolute power measurements become more and more difficult to make.

Presently, the National Bureau of Standards provides calibration services for rf power between 30 MHz and 75 GHz, with gaps at 4 to 8 and 18 to 55 GHz. Between 75 and 220 GHz the water calorimeter developed by Sharpless may be used as set forth in U.S. Pat. No. 2,832,045. However, a recent sampling of several commercially available Sharpless units designed to operate in the 50–75 GHz region revealed (1) discrepancies as high as 3 dB among units, and (2) variations in these discrepancies with rf. This brings into question the usefulness of the Sharpless calorimeter as a primary standard for absolute measurement of power in the higher frequency bands, since it becomes progressively more difficult to construct an accurate Sharpless calorimeter as the rf increases. Thus, presently, absolute measurements of rf power are effectively limited to frequencies below about 75 GHz. This frequency limitation stems from the very nature of the methods used to make these measurements.

Absolute measurements of microwave power generally employ some type of dc or audio frequency substitution and are basically of two types, namely, bolometric and calorimetric. In both types the electromagnet energy is transformed into heat. In the bolometric type of measurement the thermal energy is used to effect a resistance change or to generate an emf in a suitable element. In the calorimetric type, the thermal energy is used to produce a temperature change in a suitable fluid, e.g., water or oil. In both cases the rf power is then assumed to be equal to the power of a dc or audio frequency signal which upon conversion to heat under "identical" conditions yields the same change. The three major sources of error are mismatch loss, rf loss, and substitution. As the frequency increases, however, the substitution error emerges as the primary error since it becomes increasingly more difficult to substantiate the assumption, for a given measuring system, that the heating effects of the rf and low-frequency power are identical, or to accurately estimate to what extent they differ. Herein lies the basic reason why current methods for absolute measurements of rf power are inherently frequency limited.

BRIEF DESCRIPTION OF THE PRESENT INVENTION

It is the object of this invention to provide a method and system that does not suffer from this shortcoming and therefore permits accurate absolute measurement of rf power at all radio frequencies.

A basic feature of the method and system described herein is the direct comparison against a standard. It is this feature that gives the invention described herein its major advantage over the other methods in that it permits absolute measurement of power at all radio frequencies. The primary usefulness of the method is at millimeter and submillimeter wavelengths where no other reliable method for absolute measurement of power exists.

This method permits absolute measurements of coherent rf power at an "intermediate" level, viz, between about $-10$ and $+10$ dBm, with an accuracy of several tenths of a dB. It may, of course, be readily adapted for much higher power levels by use of directional couplers and precision attenuators.

This invention essentially involves a noise-factor measurement of a convenient superheterodyne system and a conversion loss measurement of the mixer of that system in terms of the unknown power level. The noise-figure measurement uses a noise source tube of known temperature (calibrated by means of the shock-tube primary standard, for example), and the conversion loss of the mixer is measured by the "incremental" method.

It has been shown recently by the present inventors, primarily with the aid of five theoretical published papers, that the gas-driven shock tube may be employed as a primary standard of high temperature. A method has also been described in our co-pending patent application, filed in May, 1974, for calibrating a broadband noise source against such a standard. Broadband rf noise sources of relatively high excess noise power (16 dB or higher) are available up to about 700 GHz. At higher frequencies, a convenient excess noise level may be readily obtained by stacking such sources in tandem.

The method and system described herein employs a calibrated broadband noise source as a basic component of the measuring system. The method consists essentially of measuring the system Y-factor by means of an rf noise source, and the mixer noise temperature ratio and conversion loss; making a system noise figure measurement by means of the rf source under test, whose output power $P_o$ we want to measure; measuring the noise factor of an i.f. pre-amplifier; and showing that the unknown available output power from the source under test may be computed from these measurements. Although the i.f. noise factor does come into play here, this method has the advantage of being independent of the i.f. noise bandwidth.

BRIEF DESCRIPTION OF THE FIGURE

The above-mentioned objects and advantages of the present invention will be more clearly understood when considered in conjunction with the accompanying drawing, in which:

The FIGURE is a block diagram of the system utilized in the present invention for obtaining an absolute measurement of rf power.

DETAILED DESCRIPTION OF THE INVENTION

Figure 1:
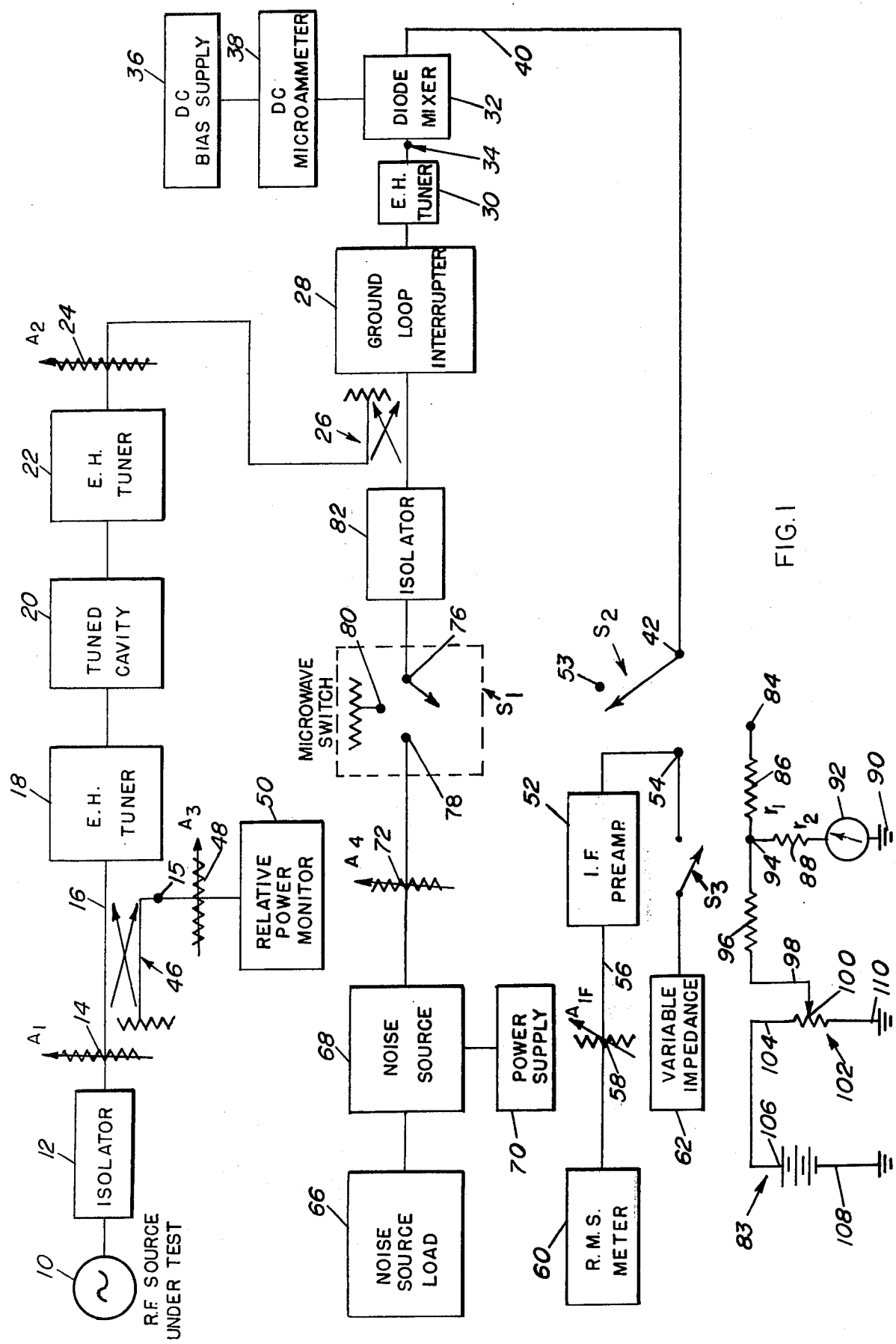

The purpose of the system illustrated in the FIGURE is to obtain the power output level of the rf source 10, under test, at the plane 34 of the diode mixer 32. The rf source 10 functions in the system of the FIGURE as a local oscillator.

Basically, in order to obtain the power output level of the source 10, several functions must be ascertained before the power output level may be calculated. These include:

| | |
|---|---|
| Y- | Y-factor |
| $F_T$ | Single-sideband system noise factor |
| $F_{IF}$ | Noise factor of i.f. pre-amplifier 52 |
| t- | Noise temperature ratio of diode mixer 32 |
| $L_c$- | Conversion loss of diode mixer 32. |

The basic circuit path in the system of the FIGURE includes the source 10 and the blocks connected to the output thereof, including diode mixer 32. More particularly, the rf source 10 is the source undergoing testing, for which the power output level is to be derived. As previously mentioned, the source 10 acts as a local oscillator in the system of the FIGURE. The isolator 12 is connected to the output of the source 10 and serves to ensure unidirectional energy travel between the source and the rf variable attentuator 14, connected to the isolator 12. A directional coupler 46 is connected between the attenuator 14 and E-H tuner 18 which is inserted in the circuit for impedance matching purposes. In order to monitor the power level from the output of the source 10, a relative power monitor 50 is connected to the output 15 of coupler 46, via the variable attenuator 48. In essence, the monitor 50 taps off power from the primary transmission path 16 for monitoring changes of power output level from the rf source 10. The monitor 50 may be in the nature of a relative-power meter or a detector in tandem with an oscilloscope, which provides a visual indication.

A tuned cavity 20 is connected to the output of the tuner 18 and serves the purpose of filtering out noise from the local oscillator (rf source). A second E-H tuner 22 is connected between the output of the tuned cavity 20 and an rf variable attenuator 24 for impedance matching purposes. The output from the variable attenuator 24 is connected to a junction including a directional coupler 26 and the output of an isolator 82. The main circuit path provides signal flow from the directional coupler 26 to a ground loop interrupter 28 which filters out unwanted energy transmission from a ground path. The interrupter is conventional, as are the previously discussed components, and is made from a lossless guide material. The output of the interrupter 28 feeds a third E-H tuner 30 which matches the impedance from the output of the ground loop interrupter 28 to the diode mixer 32. The diode mixer 32 is of conventional design and includes a crystal for performing the rf signal mixing function. Between the output of tuner 30 and the input of diode mixer 32 there is defined a plane 34 which may be the input flange of a waveguide housing (not shown) for the diode mixer 32, or a theoretical plane intersecting the crystal structure of the diode which is the heart of mixer 32. A dc bias supply 36 is provided to the diode mixer 32, through a dc microammeter 38. The output of the diode mixer 32 is indicated along line 40, which is connected to switch $S_2$.

During the measurement procedure, the system noise factor $F_T$ and Y-factor Y are derived. During such a measurement, position 42 is connected to position 54 by means of switch $S_2$ thus completing a circuit path through the i.f. pre-amplifier 52. The pre-amplifier 52 is connected at its output line 56 to a rms meter 60, via an i.f. variable attenuator 58. The measurement procedure referred to is discussed in detail hereinafter. However, the system aspect of the FIGURE will first be discussed.

A third quantity to be derived during the measurement procedure is the noise temperature ratio of the diode mixer 32, otherwise referred to as $t$. During the measurement of this quantity, the rms meter is read twice, once with switch $S_3$ open and position 42 connected to position 54 by means of switch $S_2$, and once with switch $S_2$ open and the variable impedance 62 connected to position 54 by means of switch $S_3$.

During the measurement of the previously mentioned noise factor, $F_T$, the effects from a noise source must be introduced into the system. Such a noise source, previously discussed, is indicated by reference numeral 68. Power is supplied to the source by 70. A load 66 is connected to a first output of the source 68 so that it may operate properly. A second output of the noise source 68 is coupled to a microwave switch $S_1$, via an rf precision variable attenuator 72. When the switch $S_1$ is set to connect position 76 to position 78, rf noise is introduced from the noise source 68 to the isolator 82, via microwave switch $S_1$. The output from isolator 82 feeds the directional coupler 26 wherein the noise signal may be introduced to the ground loop interrupter 28, along with the rf from the local oscillator (source 10). At certain times during the measurement procedure, the microwave switch $S_1$ is opened which requires the setting of switch $S_1$ to connect position 76 to position 80, which is a resistor loaded position.

MEASUREMENT PROCEDURE

The criterion for choosing the intermediate frequency rests primarily on whether or not there is to be suppression of the AM noise of the rf source 10, under test. The noise is suppressed in the i.f. spectrum window under consideration, by building a narrow rf filter, in the nature of tuned cavity 20. If we do not, then we must choose an i.f. far enough away from the rf line (e.g., 400 MHz, and sometimes even as high as several gigahertz) so that the contribution of the rf source 10 to the AM noise in the i.f. spectrum window is negligible. However, here if we choose not to include a tuned cavity, then we must provide sufficient i.f. bandwidth to accommodate the frequency drift of the rf source 10, under test.

A convenient i.f., say 30 MHz and a convenient i.f. bandwidth, say 6 MHz, are typical. The diode mixer is biased into the linear region by means of the dc power supply 36 and the power from the rf source 10, under test, with the degree of bias supplied by each depending on the value (between about −10 and +10 dBm) of the rf level at the plane 34.

Now, by use of the noise source 68, the single-sideband system noise figure $F_T$ is measured as follows: with $S_1$ set to connect position 76 to position 80, $S_2$ set to connect position 42 to position 54 and $S_3$ open, the precision i.f. attenuator 58 is adjusted for a convenient indication on the rms meter 60. Now $S_1$ is set to connect position 76 to position 78, the rf precision attenuator 72 at zero attenuation, and 58 is readjusted to bring the rms meter 60 back to its previous value. The ratio of the two readings in the attenuator 58 will be referred to as the Y-factor. Usually, the Y-factor can be conveniently measured to an accuracy of about 0.01 dB, regardless of its value. Thus, at any rf band under consideration, the most sensitive mixer available should be used in order to insure the highest system accuracy. The system noise factor $F_T$ is computed from the expression $$F_T = (2N - 1)/Y = 1) \tag{1}$$

where $N$ is the available excess noise power from the source at the plane 34 of the mixer diode, (i.e., the excess available noise power, expressed as a numeric, at the terminals of the noise source multiplied by the loss in the path between the noise source and the mixer 32). The factor of 2 in Equation (1) accounts for the fact that the noise supplies power in two i.f. spectrum windows, above and below the local oscillator frequency.

With $S_1$ connecting position 76 to position 80, and $S_2$ connecting position 42 to 53, the i.f. output impedance of the diode mixer 32 (while biased by dc 36 and rf source 10) is measured by means of an impedance bridge (not shown in the FIGURE), connected to position 42. An accurate measurement requires a bridge having an output signal sufficiently small — e.g., less than 1 mV open-circuit voltage from a 50 ohm generator impedance — so as to have negligible influence on the impedance of the mixer. This is particularly true when the mixer conversion loss is relatively low. Now the noise factor $R_{IF}$ of the i.f. pre-amplifier 52, when fed from a generator impedance equal to that of the i.f. output impedance of the diode mixer 32, is measured by conventional methods. This measurement involves an absolute power measurement at the i.f. frequency and can be made to an accuracy of 0.05 dB or better.

The noise temperature ratio $t$ of the mixer is measured as follows: with $S_1$ connecting position 76 to position 80 and $S_2$ connecting position 42 to position 54, attenuator 58 is adjusted for a convenient indication on the rms meter 60; then $S_2$ is switched to connect position 42 to position 53, $S_3$ is set to connect the variable impedance 62 to position 54, the variable impedance 62 is adjusted to equal the i.f. output impedance of the mixer 32, and attenuator 58 is readjusted so that the rms meter 60 gives the same reading. The ratio of the two readings of attenuator 58 (each expressed as a numeric) is equal to the noise temperature ratio $t$ of the mixer 32.

A further quantity to be determined from the system of the FIGURE is conversion loss of the diode mixer 32. In order to evaluate the conversion loss, a resistive network generally indicated by reference numeral 83 is shown in the FIGURE. The network includes a first input terminal or switch position 84. A resistor 86 ($r_1$) is connected between the terminal 84 and junction point 94. A second resistor 96 is connected between the junction point 94 and the wiper 100 of a potentiometer 102, via connecting lead 98. The upper terminal of potentiometer 102 is indicated by reference numeral 104 while the opposite end is grounded at 110. A further resistor 88 ($r_2$) is connected between the junction point 94 and ground 90, via milliammeter 92. A dc source 106 is connected between the upper terminal 104 of potentiometer 102 and ground, at 108.

Now the conversion loss of the mixer 32 is measured by the incremental method in the following way: switch $S_1$ is set to connect position 76 to position 80, and $S_2$ is set to connect position 42 to position 84. The circuit to the left of position 84 permits us to simulate both the dc and i.f. impedance that the mixer 32 sees. Its function is to measure the change in crystal current of the diode mixer 32, corresponding to a small change in the local oscillator (source 10) level. Let 86 ($r_1$) be several ohms and 88 ($r_2$) several hundred ohms; and let $r_1 + r_2$ be equal to the resistive component of the i.f. impedance of the mixer 32, measured earlier.

The 50-kΩ potentiometer 102 is adjusted for a null on the milliameter 92. The setting of the precision rf attenuator 14 is increased to give a 10-percent decrease in the local oscillator (source 10) level, and the corresponding milliameter reading is recorded. The setting of attenuator 14 is now decreased past its original position to give a 10-percent increase in the local oscillator power and again the corresponding change in the milliammeter reading is recorded.

We will subsequently refer to the 20-percent change in the local oscillator as $\Delta P$, and to the corresponding current change as $\Delta I$. It should be noted that as far as the local oscillator is concerned, the diode sees $r_1$ to ground, but as far as $\Delta P$ is concerned, the diode sees $r_1 + r_2$ to ground.

The prior art has developed a phenomenological theory of the crystal diode mixer 32, wherein the mixer is conceived as a black box with two rf and two dc terminals. The theory makes it possible to determine all elements of the mixer's admittance matrix from three measurements: the local oscillator power level, a convenient change in that level and the corresponding change in the current at the diode mixer's dc terminal 40.

It can be readily shown that by use of the abovementioned theory, we may obtain the following expression for the mixer conversion loss, $L_c$ $$L_c = \frac{g_b}{2 P_o \left(\frac{\delta I}{\delta P}\right)^2} \cdot \frac{4 g_b \frac{\delta I}{\delta V}}{\left(g_b + \frac{\delta I}{\delta V}\right)^2} \tag{2}$$

where $g_b$ is the i.f. load conductance, $g_b = (1/r_1 + r_2)$; $(\delta I/\delta V)$ is the i.f. conductance of the mixer under the conditions of measurement, $P_o$ is the average available local oscillator power at the plane 34 of the diode mixer 32; and $(\delta I/\delta P)$ is the rate of change of i.f. current with rf input power.

Frequently, we may set $g_b$ equal to $(\delta I/\delta V)$, with a loss in accuracy of only about a tenth of a dB. Therefore, for the sake of simplicity, we will restrict ourselves here to this case. Thus, Equation (2) becomes $$L_c = \frac{g_b}{2 P_o \left(\frac{dI}{dP}\right)^2} \tag{3}$$

A total local oscillator (source 10) change ΔP of 20-percent (±10 percent) was chosen so that it could be measured accurately (±0.05 dB) by milliammeter 92. For most mixers (operating at about 0 dBm LO), $$\frac{dI}{dP} \approx \frac{\Delta I}{\Delta P}$$

is a good approximation if (ΔP/P) less than ±15 percent.

Expressing ΔP as 0.2 $P_o$, we get $$L_c = 0.02 \frac{g_b P_o}{(\Delta I)^2} \tag{4}$$

The system noise factor $F_T$, which was measured earlier by use of the noise source 68 having an available excess noise power $N$, may also be expressed as $$F_T = L_c(t + F_{IF} - 1) \tag{5}$$

where all quantities on the right-hand side have been defined earlier.

Combining Equations (4) and (5), and solving for $P_o$, we get $$P_o = 50 \frac{(\Delta I)^2 F_T}{g_b(t + F_{IF} - 1)} \tag{6}$$

Since all quantities on the right-hand side of the equation have been measured, $P_o$, the power output level of the rf source under test at the plane 34 of the mixer, may be readily calculated.

We wish it to be understood that we do not desire to be limited to the exact details of construction shown and described, for obvious modifications can be made by a person skilled in the art.

We claim the following:

1. A method for measuring coherent rf power from an rf source having its output connected to a mixer and an i.f. pre-amplifier, the steps comprising:
    measuring the noise factor of a system to which the source is connected;
    measuring the noise factor of the i.f. pre-amplifier;
    measuring the noise temperature ratio of the mixer;
    measuring the i.f. conductance of the output of the mixer;
    measuring the changes in dc current from the mixer as a result of changes in rf power from the source; and
    calculating the absolute coherent rf power in accordance with $$P_o = 50 \frac{(\Delta I)^2 F_T}{g_b(t + F_{IF} - 1)}$$

where
    $P_o$ is the rf power at the plane of the mixer;
    $\Delta I$ is the change in dc current from the mixer;
    $F_T$ is system noise factor;
    $F_{IF}$ is the i.f. pre-amplifier noise factor;
    $g_b$ is i.f. conductance; and
    $t$ is the noise temperature ratio of the mixer.

2. In a system for performing measurements of quantities of coherent rf power from an rf source, a network for determining system noise factor comprising:
    rf mixing means connected in circuit to the output of the source for generating an output signal from the mixing means;
    i.f. amplifying means for amplifying the i.f. content of the output signal;
    switching means connected to the output of the mixing means for selectively connecting this output to the i.f. amplifying means, in a first switching position;
    means selectively connected to the input of the mixing means for introducing thereto a source of noise; and
    means connected in circuit to the output of the amplifying means for determining the system noise factor.

3. The subject matter of claim 2 together with variable impedance means selectively connected with the input of the amplifying means for determining the noise temperature ratio of the mixing means.

4. The subject matter of claim 2 together with a resistive network selectively connected to the output of the mixing means in a second switching position, for determining the changes in dc current from the mixing means with rf input power being applied from the source.

5. A system for performing measurements of quantities of coherent rf power from an rf source, the system comprising:
    a network for determining a system noise factor, the network including:
        rf mixing means connected in circuit to the output of the source for generating an output signal from the mixing means;
        i.f. amplifying means for amplifying the i.f. content of the output signal;
        switching means connected to the output of the mixing means for selectively connecting this output to the i.f. amplifying means, in a first switching position;
        means selectively connected to the input of the mixing means for introducing thereto a source of noise; and
        means connected in circuit to the output of the amplifying means for determining the system noise factor;
    variable impedance means selectively connected with the input of the amplifying means for determining the noise temperature ratio of the mixing means;
    a resistive network selectively connected to the output of the mixing means in a second switching position, for determining the changes in dc current from the mixing means with rf input power being applied from the source.

6. The subject matter set forth in claim 5 together with power tap off means connected between the source and the mixing means to monitor changes in relative power delivered by the source.

7. The subject matter set forth in claim 6 together with a microwave switch connected to an output of the noise source means for selectively introducing the effects of noise to the mixing means.

8. The subject matter set forth in claim 7 together with a ground loop interrupter connected to the input of the mixing means for eliminating noise introduced from a ground path to the mixing means.

9. The subject matter set forth in claim 8 wherein the mixing means includes a crystal diode.

10. The subject matter set forth in claim 8 together with a tuned cavity connected in circuit with the output of the source for filtering out noise therefrom.

* * * * *